(12) United States Patent
Peng et al.

(10) Patent No.: US 8,809,832 B1
(45) Date of Patent: *Aug. 19, 2014

(54) METHOD OF SELECTIVE PHOTO-ENHANCED WET OXIDATION FOR NITRIDE LAYER REGROWTH ON SUBSTRATES AND ASSOCIATED STRUCTURE

(71) Applicant: Opto Tech Corporation, Hsinchu (TW)

(72) Inventors: Lung-Han Peng, Hsinchu (TW); Jeng-Wei Yu, Hsinchu (TW); Po-Chun Yeh, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/788,411

(22) Filed: Mar. 7, 2013

Related U.S. Application Data

(63) Continuation of application No. 13/086,663, filed on Apr. 14, 2011, now Pat. No. 8,409,892.

(51) Int. Cl.
   *H01L 29/06* (2006.01)

(52) U.S. Cl.
   USPC .......... 257/13; 257/88; 257/76; 257/615; 257/43; 257/94; 257/98; 438/478; 438/27

(58) Field of Classification Search
   USPC ............ 257/13, 88, 76, 615, 43, 94, 98; 438/478, 27
   See application file for complete search history.

(56) References Cited

U.S. PATENT DOCUMENTS

| | | | |
|---|---|---|---|
| 6,515,313 B1 | 2/2003 | Ibbetson et al. | |
| 7,675,084 B2 * | 3/2010 | Wierer et al. | 257/98 |
| 7,952,109 B2 * | 5/2011 | Ng | 257/94 |
| 8,309,439 B2 * | 11/2012 | Seifert et al. | 438/478 |
| 8,409,892 B2 | 4/2013 | Peng et al. | |
| 2009/0045427 A1 * | 2/2009 | Wierer et al. | 257/98 |
| 2009/0079034 A1 * | 3/2009 | Wang | 257/615 |
| 2010/0264446 A1 | 10/2010 | Niki et al. | |
| 2010/0308323 A1 * | 12/2010 | Chang Jean et al. | 257/43 |
| 2010/0317132 A1 * | 12/2010 | Rogers et al. | 438/27 |
| 2012/0061660 A1 * | 3/2012 | Lu et al. | 257/43 |
| 2013/0168708 A1 * | 7/2013 | Shibata et al. | 257/88 |
| 2013/0200391 A1 * | 8/2013 | Bedair et al. | 257/76 |

OTHER PUBLICATIONS

Cho, et al., "Green Light-Emitting Diodes on Semipolar {1122} Microfacets Grown by Selective Area Epitaxy", Nov. 2009, Journal of the Electrochemical Society.

(Continued)

*Primary Examiner* — Fernando L Toledo
*Assistant Examiner* — Mohammed Shamsuzzaman
(74) *Attorney, Agent, or Firm* — WPAT, PC; Justin King

(57) ABSTRACT

Various embodiments of the present disclosure pertain to selective photo-enhanced wet oxidation for nitride layer regrowth on substrates. In one aspect, a method may comprise: forming a first III-nitride layer with a first low bandgap energy on a first surface of a substrate; forming a second III-nitride layer with a first high bandgap energy on the first III-nitride layer; transforming portions of the first III-nitride layer into a plurality of III-oxide stripes by photo-enhanced wet oxidation; forming a plurality of III-nitride nanowires with a second low bandgap energy on the second III-nitride layer between the III-oxide stripes; and selectively transforming at least some of the III-nitride nanowires into III-oxide nanowires by selective photo-enhanced oxidation.

14 Claims, 9 Drawing Sheets

(56) References Cited

OTHER PUBLICATIONS

Feng, et al, "Green light emission from InGaN multiple quantum wells grown on GaN pyramidal stripes using selective area epitaxy", Nov. 2008, Journal of Applied Physics.

Lai, et al., "GaN-based light emitting diodes with embedded SiO2 pillars and air gap array structures", Aug. 2010, Applied Physics Letters 97.

USPTO, "Office Action", Apr. 2, 2014.

* cited by examiner

METHOD OF SELECTIVE PHOTO-ENHANCED WET OXIDATION FOR NITRIDE LAYER REGROWTH ON SUBSTRATES AND ASSOCIATED STRUCTURE

This is a continuation application of co-pending U.S. application Ser. No. 13/086,663, filed Apr. 14, 2011, the subject matter of which is incorporated herein by reference.

BACKGROUND

1. Technical Field

Various embodiments of the present disclosure relate to semiconductor light-emitting devices and, more particularly, to a method of selective photo-enhanced wet oxidation for nitride layer regrowth on substrates.

2. Description of the Related Art

Light-emitting diodes (LEDs) are a type of semiconductor-based light source. An LED typically includes semiconducting materials doped with impurities to create a p-n junction. The wavelength of the light emitted, and thus its color, depends on the bandgap energy of the materials forming the p-n junction. In silicon or germanium diodes, the electrons and holes recombined by a non-radiative transition produce no optical emission, because these are indirect bandgap materials. The materials used for the LED have a direct bandgap with energies corresponding to near-infrared, visible or near-ultraviolet light. LEDs are usually built on an n-type substrate with an electrode attached to the p-type layer deposited on its surface. LEDs built on p-type substrates, while less common, are available as well. Many commercial LEDs, especially GaN/InGaN, also use sapphire substrate.

Blue LEDs are based on the wide bandgap III-nitride materials such as, for example, GaN (gallium nitride) and InGaN (indium gallium nitride). Blue LEDs typically have an active region consisting of one or more InGaN quantum wells sandwiched between thicker layers of GaN, called cladding layers. By varying the relative InN—GaN molar fraction in the InGaN quantum wells, the light emission can be varied from violet to amber. AlGaN (aluminum gallium nitride) of varying AlN molar fraction can be used to manufacture the cladding and quantum well layers for ultraviolet LEDs, but these devices have not yet reached the level of efficiency and technological maturity of the InGaN—GaN blue/green devices. If the active quantum well layers are GaN, instead of alloyed InGaN or AlGaN, the device will emit near-ultraviolet light with wavelengths around 350-370 nm. Green LEDs manufactured from the InGaN—GaN system are far more efficient and brighter than green LEDs produced with non-nitride material systems.

Advancements have been achieved in recent years to increase the external quantum efficiency of LEDs. Among the various techniques, one known approach is to form a plurality of protrusions on a surface of a C plane (0001) sapphire substrate in a two-dimensionally repeated pattern, and then epitaxially grow a number of GaN-based semiconductor layers on the sapphire substrate. The repeated pattern has a pitch greater than or equal to λ/4 and less than or equal to 20 μm, and side surfaces of the protrusions have an inclined angle that is not less than 90° and not more than 160°. Accordingly, the external quantum efficiency of LEDs thus formed is said to be increased as a result of an optical beam diffraction mechanism due to the two-dimensional pattern of protrusions on the sapphire substrate.

With respect to forming a number of protrusions on a surface of a sapphire substrate in a two-dimensionally repeated pattern, a number of approaches have been proposed but each is not without disadvantages. For example, one approach aligns a $SiO_2$ stripe mask parallel to the $[11\bar{2}0]$ direction of GaN to produce optically smooth layers on the inclined semi-polar $\{1\bar{1}01\}$ GaN facets. However, impurity migration from the mask region ($SiO_2$) can cause serious material contamination issues to the growth of nitride layers thereafter. Another approach aligns the $SiO_2$ stripe mask parallel to the $[1\bar{1}00]$ direction of GaN to produce optically smooth layers on the inclined semi-polar $\{11\bar{2}2\}$ GaN facets. However, as with the aforementioned approach, impurity migration from the $SiO_2$ mask region can cause serious material contamination issues to the growth of nitride layers thereafter.

On the other hand, V-notch grooves may be found in an LED structure comprising adjacent layers of Al(Ga)N/In(Ga)N with high bandgap energy and low bandgap energy. Screw dislocations, which are undesirable, tend to exist at the bottom of the V-notch grooves. Etch pit density (EPD) is a measure for the quality of semiconductor wafers. An etch solution, such as molten KOH at 450° C., is applied on the surface of the wafer where the etch rate is increased at dislocations, such as screw dislocations, of the crystal resulting in pits. To suppress further propagation of screw dislocations, one approach utilizes a photolithographic method with alignment procedures which require additional time and costs in operation and equipment. Other approaches require $SiO_2$ masking or dry etch. However, such techniques may result in undesirable impurity migration and/or damage to the crystal atomic structure.

SUMMARY

Various embodiments of the present disclosure pertain to techniques of fabrication of LED structures using selective photo-enhanced wet oxidation and suppression of propagation of screw dislocations in LED structures using selective photo-enhanced oxidation.

In one aspect, a method may comprise: forming a first III-nitride layer with a first low bandgap energy on a first surface of a substrate; forming a second III-nitride layer with a first high bandgap energy on the first III-nitride layer; transforming portions of the second III-nitride layer into a plurality of III-oxide stripes by photo-enhanced wet oxidation; forming a plurality of III-nitride nanowires with a second low bandgap energy on the second III-nitride layer between the III-oxide stripes; and selectively transforming at least some of the III-nitride nanowires into III-oxide nanowires by selective photo-enhanced oxidation.

In one embodiment, the selective photo-enhanced wet oxidation may comprise photo-enhanced wet oxidation with a photonic energy between the first high bandgap energy and the first low bandgap energy.

In one embodiment, the III-nitride nanowires may comprise In/GaN nanowires, and wherein the III-oxide nanowires comprise $(In/Ga)2O3$ nanowires.

In one embodiment, the substrate may comprise a C plane (0001) sapphire substrate, wherein the second III-nitride layer comprises a layer of GaN, and wherein the III-oxide stripes are aligned substantially parallel to a $[11\bar{2}0]$ or $[1\bar{1}00]$ direction of GaN.

In one embodiment, the method may further comprise: forming a third III-nitride layer on the second III-nitride layer and over the III-oxide nanowires; and removing the III-oxide nanowires to form a plurality of air gaps in the third III-nitride layer.

Forming a third III-nitride layer may comprise forming the third III-nitride layer by lateral epitaxy of the III-nitride layer using a metal-organic chemical vapor deposition (MOCVD) process. Removing the III-oxide nanowires may comprise dissolving the III-oxide nanowires using an acidic electrolyte or a basic electrolyte.

The method may further comprise filling the air gaps with a thermally conductive material, the thermally conductive material comprising a plurality of nanoparticles, a plurality of compound particles, or a combination thereof.

Alternatively or additionally, the method may further comprise filling the air gaps with an electrically conductive material, the electrically conductive material comprising a plurality of nanoparticles, a plurality of compound particles, or a combination thereof.

In one embodiment, the method may further comprise forming a plurality of III-nitride layers on the third III-nitride layer to form at least one LED.

In another aspect, a method may comprise: forming a first III-nitride layer with a first low bandgap energy on a first surface of a C plane (0001) sapphire substrate; forming a second III-nitride layer with a first high bandgap energy on the first III-nitride layer; forming an LED structure over the second III-nitride layer; and forming, at least in part by selective photo-enhanced oxidation, in the LED structure a plurality of air gaps that are parallel to one another and adjacent the second III-nitride layer.

In one embodiment, forming, at least in part by selective photo-enhanced oxidation, a plurality of air gaps that are parallel to one another and adjacent the second III-nitride layer may comprise: transforming portions of a surface of the second III-nitride layer into a plurality of III-oxide stripes by photo-enhanced wet oxidation; forming a plurality of III-nitride nanowires with a second low bandgap energy on the second III-nitride layer between the III-oxide stripes; selectively transforming at least some of the III-nitride nanowires into III-oxide nanowires by selective photo-enhanced oxidation; forming a third III-nitride layer on the second III-nitride layer and over the III-oxide nanowires; and removing the III-oxide nanowires to form the plurality of air gaps.

In one embodiment, the selective photo-enhanced wet oxidation may comprise photo-enhanced wet oxidation with a photonic energy between the first high bandgap energy and the first low bandgap energy.

In one embodiment, removing the III-oxide nanowires may comprise dissolving the III-oxide nanowires using an acidic electrolyte or a basic electrolyte.

In one embodiment, the method may further comprise filling the air gaps with a thermally conductive material, the thermally conductive material comprising a plurality of nanoparticles, a plurality of compound particles, or a combination thereof. Alternatively or additionally, the method may further comprise filling the air gaps with an electrically conductive material, the thermally conductive material comprising a plurality of nanoparticles, a plurality of compound particles, or a combination thereof.

In one embodiment, the method may further comprise, after forming the second III-nitride layer on the first III-nitride layer and before forming the LED structure over the second III-nitride layer, forming a surface passivation layer in a V-notch groove that is in the second III-nitride layer or in a combination of the second III-nitride layer and the first III-nitride layer by selective photo-enhanced oxidation.

In one embodiment, the surface passivation layer may comprise a III-oxide layer.

In one embodiment, forming the LED structure over the second III-nitride layer may comprise forming a third III-nitride layer on the surface passivation layer and the second III-nitride layer by lateral epitaxy of the III-nitride layer using an MOCVD process.

In one aspect, a method of suppressing screw dislocation in an LED structure may comprise: forming a first III-nitride layer with a first low bandgap energy on a first surface of a substrate; forming a second III-nitride layer with a first high bandgap energy on the first III-nitride layer; and forming a surface passivation layer of III-oxide in a V-notch groove that is in the second III-nitride layer or in a combination of the second III-nitride layer and the first III-nitride layer by selective photo-enhanced oxidation.

In one embodiment, the method may further comprise forming a third III-nitride layer on the surface passivation layer and the second III-nitride layer by selective lateral epitaxy of the third III-nitride layer using an MOCVD process.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

Figure 1A:
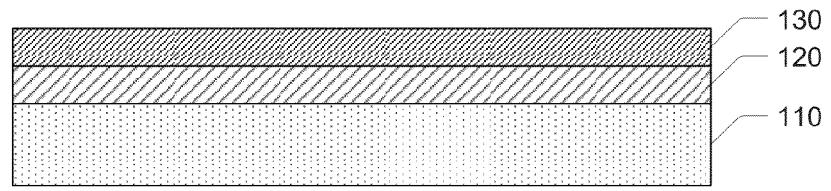
FIGS. 1A-1G are diagrams showing progression in fabrication of an LED structure in accordance with an embodiment to the present disclosure.

Various embodiments of the present disclosure pertain to techniques of selective photo-enhanced wet oxidation in fabrication of LED structures and in suppression of propagation of screw dislocations in LED structures.

In a semiconductor structure where a layer of III-nitride with low bandgap energy $E_{g,Lo}$ and a layer of III-nitride with high bandgap energy $E_{g,Hi}$ are deposited one above the other, selective photo-enhanced wet oxidation with a photonic energy hy, where $E_{g,Lo}<hy<E_{g,Hi}$, can transform III-nitride compounds with $E_{g,Lo}$ into III-oxide compounds. This technique can be utilized to form III-oxide nanowires over the layers of III-nitride. Lateral expitaxy of a new layer of III-nitride over the existing layers of III-nitride and III-oxide nanowires can then be achieved by MOCVD. Afterwards, air gaps can be formed by dissolving the III-oxide nanowires using an acidic electrolyte or a basic electrolyte. The air gaps provide crystal lattice momentum for optical diffraction to advantageously result in increased external quantum efficiency similar to that achieved by the approach of having a plurality of protrusions repeated in a two-dimensional pattern on a surface of a C plane (0001) sapphire substrate. The air gaps also promote heat dissipation from the LED structure during operation. However, the proposed technique of the present disclosure advantageously removes the source of material contamination due to the mask layer.

Suppression of propagation of screw dislocation at the bottom of V-notch grooves in a layer of III-nitride with low bandgap energy in a semiconductor structure may be achieved by using selective photo-enhanced oxidation to form a surface passivation layer to fill in the bottom portion of the V-notice grooves. Afterwards, a III-nitride layer may be selectively grown by lateral epitaxy. This technique avoids the relatively higher costs and longer time associated with using illumination alignment procedures. Issues such as undesirable impurity migration and/or damage to the crystal atomic structure associated with $SiO_2$ masking or dry etch can also be avoided.

Referring to FIGS. 7-11, a photo-enhanced chemical oxidation/etching process in accordance with the present disclosure will now be introduced as embodiments of the inventive techniques of the present disclosure, to be described later, utilize one or more aspects of photo-enhanced chemical oxidation/etching.

Photo-Enhanced Chemical Oxidation (Etching)

A photo-enhanced chemical (PEC) oxidation/etching process is a kind of photochemistry process. In III-nitride materials, this process consists of applying a ultraviolet (UV) irradiation onto a galvanic cell formed by immersing a III-nitride working electrode, a platinum (Pt) counter electrode, and a reference electrode in an electrolyte. The resultant reaction is that the UV-excited hot carriers at the III-nitride/electrolyte interface have excess energy to access the $H+/H_2$ and $OH-/O_2$ redox levels in water and enhance the oxidative dissolution of III-nitride specimen.

Figure 7:
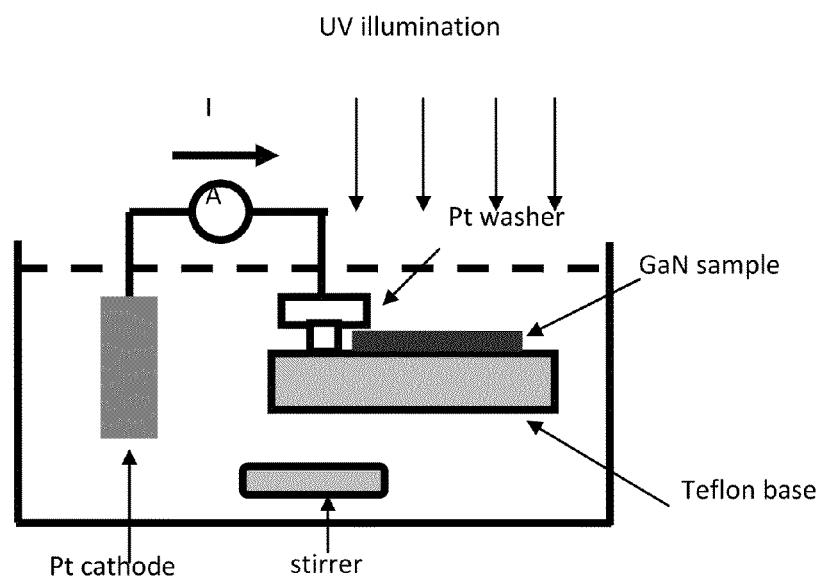
FIGS. 7-11 are diagrams relating to a photo-enhanced chemical oxidation (etching) process in accordance with the present disclosure.

FIG. 7 shows an experimental setup. One or more samples are mounted on a Teflon base and clipped by a Pt washer. The Pt wire cathode and ammeter are used to monitor the reaction current flowing in the reaction cell. A 253.7 nm mercury (Hg) line source is used to illuminate the whole sample surface with UV light of intensity of about 20 mW/cm$^2$. Ultraviolet illumination generates electron-hole pairs and enhances the oxidation and reduction reactions at the semiconductor surface. The solution can be KOH, $H_3PO_4$, etc. for etching process and $CH_3COOH/CH_3COONH_4$ buffer solution for oxidation. It has been proposed that the PEC etching of GaN occurs through oxidative decomposition, in which photo-generated holes assist in the oxidation and subsequent dissolution of the semiconductor into aqueous acid or base solution. The oxidation reaction below is responsible for the decomposition of GaN, where $e^-/h^+$ stands, separately, for photo-generated electron/hole.

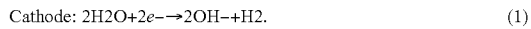

Cathode: $2H2O+2e-\rightarrow 2OH-+H2.$ (1)

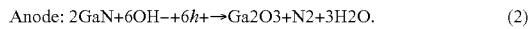

Anode: $2GaN+6OH-+6h+\rightarrow Ga2O3+N2+3H2O.$ (2)

Gallium oxide formed on the interface of semiconductor and electrolyte can be removed (etching) or preserved (oxidation) depending on the solution in PEC process. The surface energy band diagrams for GaN of different doping types are shown in FIG. 8.

Figure 8:
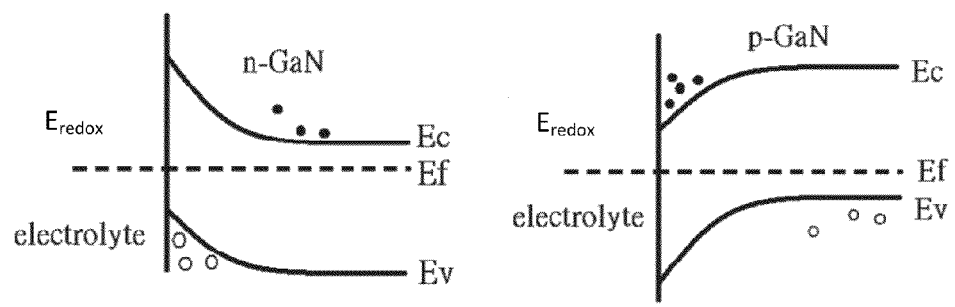

FIG. 8 illustrates the band bending of n- and p-type at the semiconductor/electrolyte interface. Upward (n-GaN) and downward (p-GaN) band bending at the surface of the GaN occurs due to the types of dopant in the GaN films. For n-type GaN, the photo-generated holes can be effectively accumulated near the semiconductor/electrolyte interface and, therefore, assists the reaction and oxidation of GaN. However, in p-type GaN the downward band bending accumulates the electrons near the interface. The electron accumulation enhances the bond strength between Ga—O and results in not only the slowing down of the dissolution rate of $Ga_2O_3$ but also inhibiting further oxidation of GaN.

Photo-Enhanced Chemical Wet Oxidation Characteristics of GaN

There have been few reports on the oxidation or etching characteristics of GaN or its related compounds from crystallographic aspects, e.g., orientation effect on etching rates, shapes of pits and hillocks, and dissolution processes. To the inventors' knowledge, there has been no report on the orientation effects of GaN wet chemical oxidation.

Figure 9:
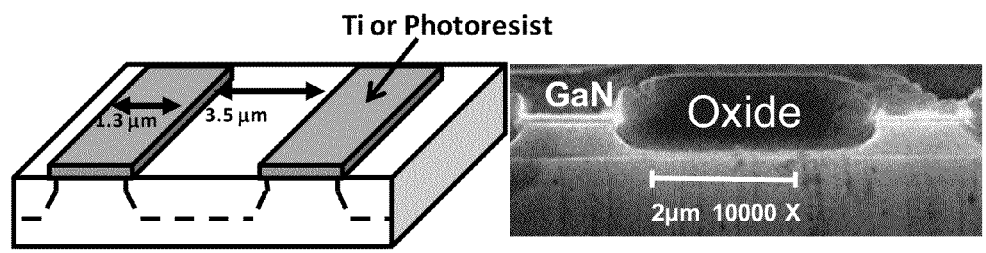

To this purpose, the inventors employed a 4 μm-thick n-type GaN epilayer grown on sapphire by metal-organic chemical vapor deposition (MOCVD). The substrate was lapped and polished to the thickness of about 90 μm to permit cleavage for the observation of etching profiles. A thin titanium metal or photoresist strip of approximately 100 nm parallel to the $[11\bar{2}0]_{GaN}$ direction was deposited on the sample by standard photolithography and lift-off techniques. The electrochemical cell is shown in FIG. 7 with Ti or photoresist contact formed on the edge of each sample to serve as PEC working electrode and Pt as counter electrode. A buffered acetic acid electrolyte ($CH_3COOH/CH_3COONH_4$) of pH value 6.4 was prepared to adjust the redox Fermi level with respect to the band-edge of GaN. FIG. 9 displays an illustrative scanning electron micrograph revealing the cleaved cross-sectional oxidation profile after PEC oxidation for 2 hours and dehydrated at 350° C. for 1 hour.

Figure 10:
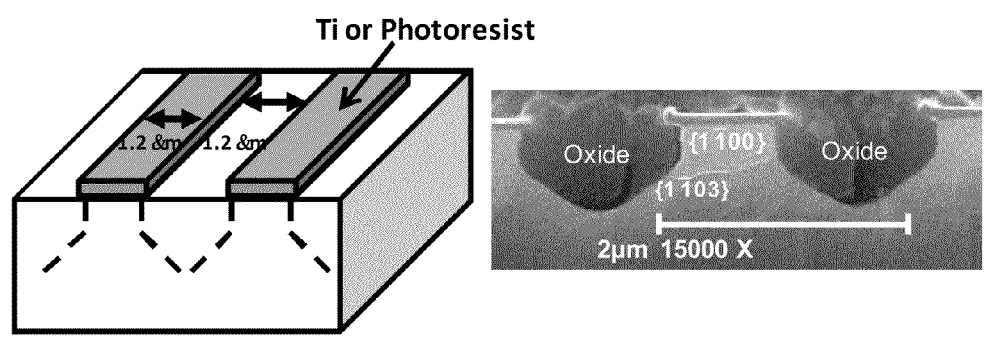

It can be observed that volume expansion occurred in the conversion of GaN to $Ga_2O_3$. Moreover, cracks on oxide indicate the release of strain inside the oxide layer. It is interesting to note that the oxidation profile reveals anisotropic reaction rate. From the underlying profile beneath oxide, the oxidation rate along $[000\bar{1}]$ is about 10 times faster than that along $[1\bar{1}00]_{GaN}$. The anisotropic property may result from the difference between both the surface energy and surface field of GaN of different crystallographic plane. In the present case, the PEC oxidation process was enhanced by the internal field along $[000\bar{1}]$ caused by surface band bending of GaN. As a result of the direction of the internal field (along c-axis), the non-polar plane of $\{1\bar{1}00\}_{GaN}$ and $\{11\bar{2}0\}_{GaN}$ are less influenced and reveal slower oxidation rate. Further investigation by repeated oxidation and oxide removing by immersing in $CH_3COOH$ solution on a 4 μm-thick GaN sample was carried out with Ti or photoresist strip parallel to the $[11\bar{2}0]_{GaN}$ direction. The strip was 1.2 μm in width with GaN opening of the same size. The GaN sample was first PEC oxidation for 2 hours followed by oxide removing, and successive oxidation for 2 hours was proceeded to reach a deep oxidation profile. As illustrated in FIG. 10, the resultant profile exhibited pentagon shape bounded by $\{1\bar{1}00\}_{GaN}$ and $\{1\bar{1}03\}_{GaN}$ with 60° inclined angle to the substrate normal.

With the crystallographic properties of PEC oxidation, various oxidation profiles can be easily formed for the application such as the vertical facet for laser, light emitting diodes, and microcavity fabrication.

Selective Photo-Enhanced Wet Oxidation (Etching)

Figure 11:
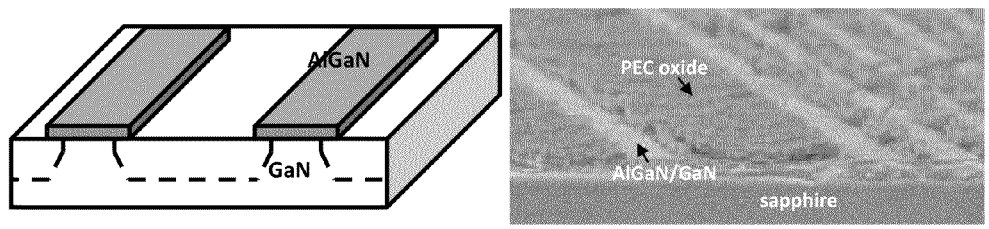

The selective photo-enhanced wet oxidation (etching) process involves triggering photo-enhanced wet oxidation with a photonic energy hν, where $E_{g,Lo}<h\nu<E_{g,Hi}$, can transform III-nitride compounds with a bandgap energy of $E_{g,Lo}$ into III-oxide compounds. For example, III-nitrides such as (In/Ga)N can be transformed into III-oxide such as $(In/Ga)_2O_3$ by selective photo-enhanced wet oxidation. Consequently, the first III-nitride layer, having a low bandgap energy $E_{g,Lo}$, is transformed into a corresponding III-oxide layer, and the second III-nitride layer, having a high bandgap energy $E_{g,Hi}$, maintains the original composition. As the typical photo-enhanced wet oxidation (etching) process, III-oxide formed on the interface of semiconductor and electrolyte can be removed (etching) or preserved (oxidation) depending on the solution in this photochemistry process. FIG. 11 is the result of selective photo-enhanced wet oxidation performed on AlGaN/GaN hetero-structure with etched grooves. Selective transformation of GaN into $Ga_2O_3$ can be done, with AlGaN remaining, without any metal mask being used.

Illustrative Fabrication of an LED Structure

Figure 1B:
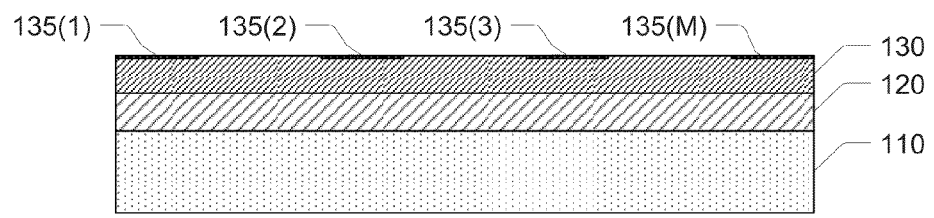
Figure 1C:
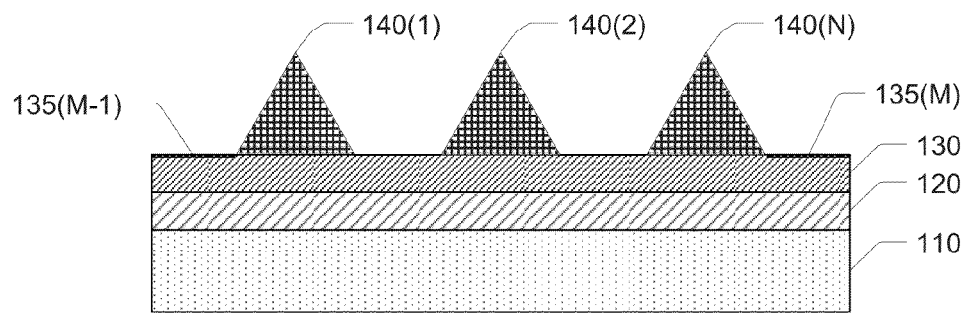

FIGS. 1A-1G are diagrams showing progression in fabrication of an LED structure in accordance with an embodiment to the present disclosure. It is to be noted that, although none of the Figures is drawn to scale, FIGS. 1A-1B are similarly drawn to one scale while FIGS. 1C-1G are similarly drawn to another different scale.

FIG. 1A illustrates a substrate 110 having a first III-nitride layer 120 deposited thereon, and a second III-nitride layer 130 deposited on the first III-nitride layer 120. In one embodiment, the substrate 110 is a sapphire substrate. In one embodiment, the substrate 110 is a C plane (0001) sapphire substrate. In other embodiments, the substrate 110 may be an A plane (11$\bar{2}$0) sapphire substrate, an R plane (1102) sapphire substrate, or an M plane (1$\bar{1}$00) sapphire substrate. The first III-nitride layer 120 and the second III-nitride layer 130 are layers of nitride compounds including those from the boron family of the Periodic Table, such as Al (aluminum), Ga (gallium), and In (indium) for example. In one embodiment, the first III-nitride layer 120 may comprise a layer of GaN, InN, AlGaN, or InGaN. In one embodiment, the second III-nitride layer 130 may comprise a layer of GaN, InN, AlGaN, or InGaN. Between the first III-nitride layer 120 and the second III-nitride layer 130, the first III-nitride layer 120 has a low bandgap energy $E_{g,Lo1}$ and the second III-nitride layer 130 has a high bandgap energy $E_{g,Hi1}$ where $E_{g,Hi1} > E_{g,Lo1}$.

FIG. 1B illustrates that a plurality of III-oxide stripes 135(1)-135(M) are formed on the top surface of the second III-nitride layer 130. More specifically, the III-oxide stripes 135(1)-135(M) are formed by a photo-enhanced wet oxidation process, such as one similar to that described above. Although a fixed number of the III-oxide stripes 135(1)-135(M) are shown, the actual number of the III-oxide stripes 135(1)-135(M) in various embodiments may be greater or smaller. Accordingly, M is a positive integer greater than 1. In one embodiment, when the second III-nitride layer 130 of a high bandgap energy comprises Al/GaN, the III-oxide stripes 135(1)-135(M) comprise $(Al/Ga)_2O_3$, respectively. The III-oxide stripes 135(1)-135(M) are parallel to one another. In one embodiment, the III-oxide stripes 135(1)-135(M) align parallel to the [11$\bar{2}$0] or [1$\bar{1}$00] direction of GaN.

FIG. 10 illustrates that a plurality of low bandgap energy III-nitride nanowires 140(1)-140(N) are grown on the second III-nitride layer 130 between the III-oxide stripes 135(M−1) and 135(M). Although a fixed number of the III-nitride nanowires 140(1)-140(N) are shown, the actual number of the III-nitride nanowires 140(1)-140(N) in various embodiments may be greater or smaller. Accordingly, N is a positive integer greater than 1. In one embodiment, the III-nitride nanowires 140(1)-140(N) have low bandgap energy $E_{g,Lo2}$, which may be the same as or different than $E_{g,Lo1}$. Given that the III-nitride nanowires 140(1)-140(N) are grown between the III-oxide stripes 135(M−1) and 135(M), the III-nitride nanowires 140(1)-140(N) are also parallel to one another and parallel to the [11$\bar{2}$0] or [1$\bar{1}$00] direction of GaN.

Figure 1D:
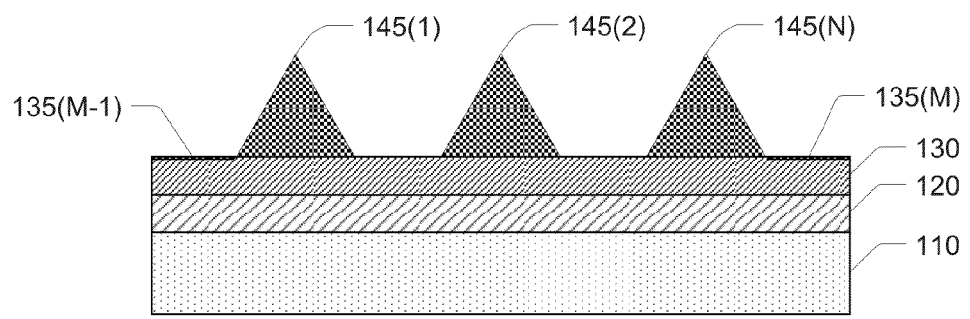

FIG. 1D illustrates the results of a selective photo-enhanced oxidation process, such as one similar to that described above, that selectively transforms at least some of the III-nitride nanowires 140(1)-140(N) into III-oxide nanowires 145(1)-145(N). More specifically, selective photo-enhanced wet oxidation with a photonic energy hv, where $E_{g,Lo} < hv < E_{g,Hi}$, can transform III-nitride compounds with $E_{g,Lo}$ into III-oxide compounds. For example, III-nitrides of a low bandgap energy such as In/GaN can be transformed into $(In/Ga)_2O_3$ by selective photo-enhanced wet oxidation.

Figure 1E:
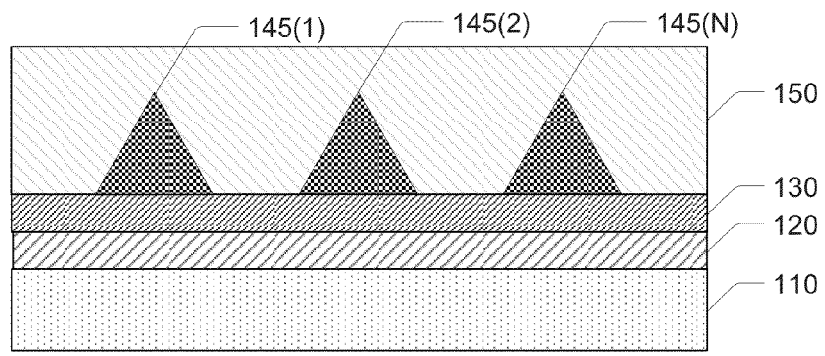

FIG. 1E illustrates that a third III-nitride layer 150 is formed on the second III-nitride layer 130 and over the III-oxide nanowires 135(M−1) and 135(M) (not shown in the far left end and far right end of FIG. 1E, respectively). The third III-nitride layer 150 may be nucleated on surface sites of the second III-nitride layer 130 not covered by the III-oxide nanowires 145(1)-145(N) nor by the III-oxide stripes 135(M−1) and 135(M). Coalescence due to lateral epitaxial growth, or lateral epitaxy, occurs and results in a flat surface comprising the third III-nitride layer 150. In one embodiment, the lateral epitaxy of the third III-nitride layer 150 is done using an MOCVD process. Given that III-nitride compounds can nucleate on a C plane (0001) sapphire substrate but cannot grow on the surface of oxides, such as a III-oxide layer, MOCVD can suitably be utilized for laterally epitaxial growth and formation of the third III-nitride layer 150.

Figure 1F:
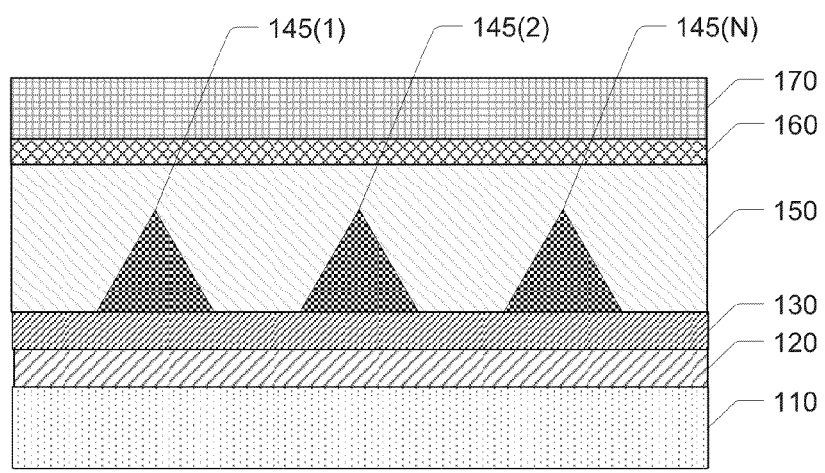

FIG. 1F illustrates that an LED structure including one or more LEDs is formed on the third III-nitride layer 150. In one embodiment, as shown in FIG. 1F, a plurality of III-nitride layers, such as a fourth III-nitride layer 160 and a fifth III-nitride layer 170, are deposited sequentially above the third III-nitride layer 150. For example, for a GaN-based LED structure, the third III-nitride layer 150 may comprise n-GaN, the fourth III-nitride layer 160 may comprise a multiple-quantum well (MQW) emission layer, and the fifth III-nitride layer 170 may comprise p-GaN. These III-nitride layers may comprise other compounds in various implementations. In other embodiments, the number of III-nitride layers deposited above the third III-nitride layer 150 may vary. A plurality of LEDs may be made by cutting the LED structure shown in FIG. 1F.

Figure 1G:
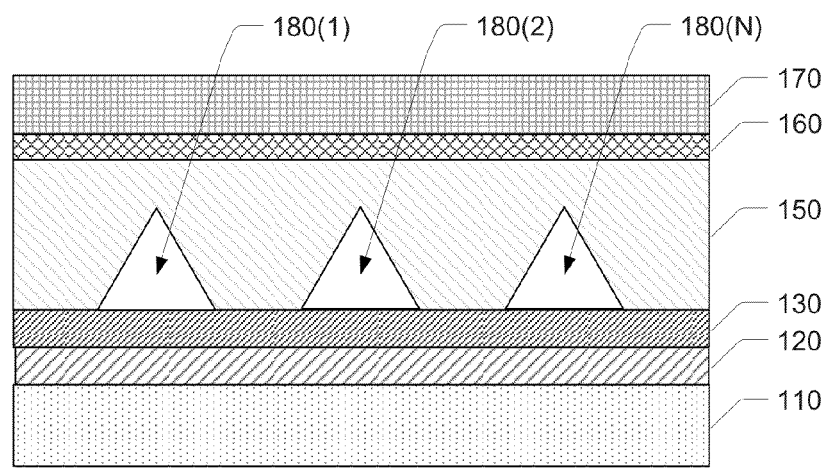

FIG. 1G illustrates the LED structure after the III-oxide nanowires 145(1)-145(N) have been removed, leaving a corresponding plurality of air gaps 180(1)-180(N). In one embodiment, given that III-oxide compounds such as $(In/Ga)_2O_3$ dissolve in weak acidic or weak basic electrolyte while III-nitride compounds do not, the III-oxide nanowires 145(1)-145(N) are removed by immersing the LED structure in a weak acidic electrolyte, e.g., $H_3PO_4$, or a weak basic electrolyte, e.g., KOH.

The air gaps 180(1)-180(N) provide crystal lattice momentum for optical diffraction to advantageously result in increased external quantum efficiency similar to that achieved by the approach of having a plurality of protrusions repeated in a two-dimensional pattern on a surface of a C plane (0001) sapphire substrate. The air gaps 180(1)-180(N) also aid heat dissipation from the LED structure during operation. However, the proposed technique of the present disclosure advantageously removes the source of material contamination due to the mask layer.

In one embodiment, the air gaps 180(1)-180(N) are filled with a thermally conductive material, which may comprise a plurality of nanoparticles, a plurality of compound particles, or a combination thereof. Additionally or alternatively, the air gaps 180(1)-180(N) are filled with an electrically conductive material, which may comprise a plurality of nanoparticles, a plurality of compound particles, or a combination thereof.

Illustrative Suppression of Propagation of Screw Dislocations

Figure 2A:
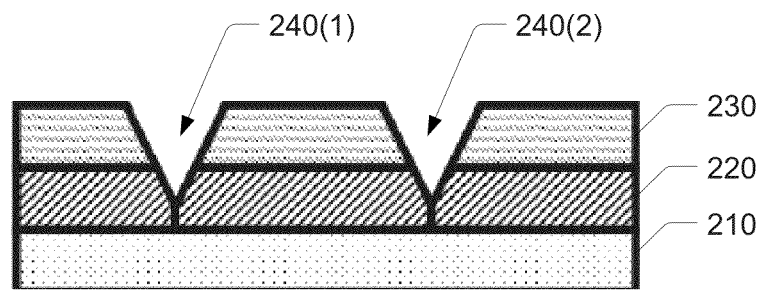
FIGS. 2A-2C are diagrams showing progression in suppression of propagation of screw dislocations in an LED structure in accordance with an embodiment to the present disclosure.
Figure 2B:
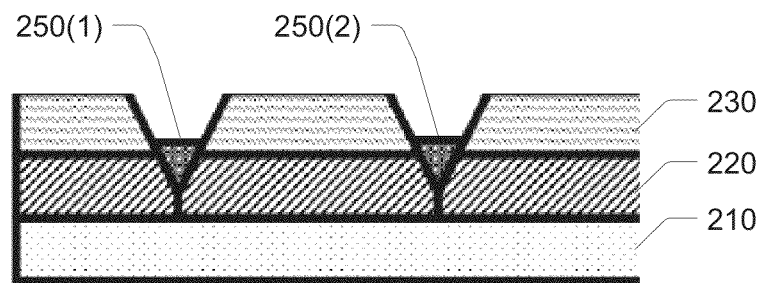
Figure 2C:
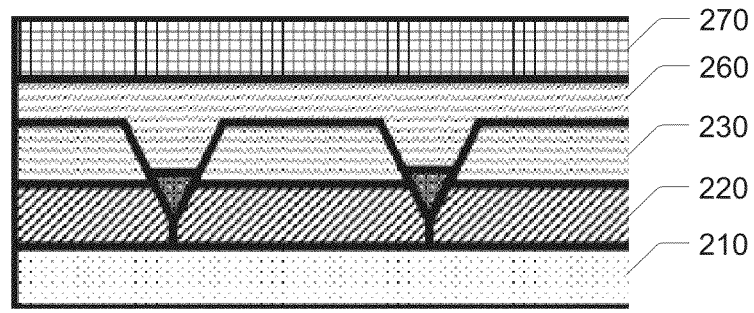

FIGS. 2A-2C are diagrams showing progression in suppression of propagation of screw dislocations in an LED structure in accordance with an embodiment to the present disclosure.

FIG. 2A illustrates an LED structure having a substrate 210, a first III-nitride 220 deposited thereon, and a second III-nitride layer 230 deposited on the first III-nitride layer 220. The first III-nitride layer 220 has a low bandgap energy $E_{g,Lo}$ and the second III-nitride layer 230 has a high bandgap energy $E_{g,Hi}$ where $E_{g,Hi}>E_{g,Lo}$. V-notch grooves 240(1) and 240(2), commonly formed on the III-nitride surface due to wet chemical etching in hot bases or acids such as KOH or $H_3PO_4$ to reveal the etch pit density, exist in the second III-nitride layer 230 or in a combination of the second III-nitride layer 230 and the first III-nitride layer 220, as shown in FIG. 2A. Screw dislocations exist at the bottom of the V-notch grooves 240(1) and 240(2).

FIG. 2B illustrates that a surface passivation layer 250(1), 250(2) is formed in each of the V-notch grooves 240(1) and 240(2), respectively. The surface passivation layer 250(1), 250(2) selectively fills up the bottom portion of the respective V-notch groove 240(1), 240(2). In one embodiment, the surface passivation layer 250(1), 250(2) comprises a III-oxide layer. For example, when the second III-nitride layer 230 and the first III-nitride layer 220 comprise In/GaN, the surface passivation layer 250(1), 250(2) may comprise $(In/Ga)_2O_3$. In one embodiment, the surface passivation layer 250(1), 250(2) is formed by selective photo-enhanced oxidation.

FIG. 2C illustrates that a third III-nitride layer 260 is formed on the surface passivation layer 250(1), 250(2) and the second III-nitride layer 230 by selective lateral epitaxy of the third III-nitride layer 260 using an MOCVD process. Further layers, such as a layer 270, may be formed on or above the third III-nitride layer 260 as necessary.

Thus, by filling the V-notch grooves 240(1), 240(2) with the surface passivation layer 250(1), 250(2), the propagation of screw dislocations can be suppressed. Unlike existing techniques, the proposed technique avoids the relatively higher costs and longer time associated with using illumination alignment procedures. Issues such as undesirable impurity migration and/or damage to the crystal atomic structure associated with $SiO_2$ masking or dry etch can also be avoided. The process can be repeated used for MOCVD regrowth in LED structures to achieve a relatively low density of dislocations, e.g., $10^7$-$10^6$ cm$^{-2}$.

Illustrative Examples

Figure 3A:
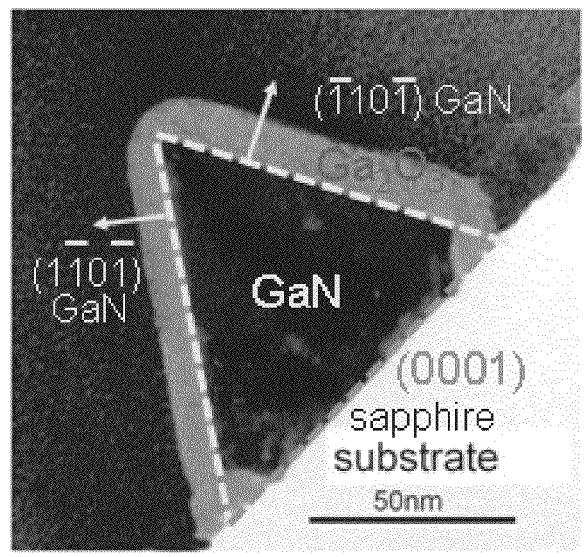
FIGS. 3A-3B are photos of examples in accordance with an embodiment to the present disclosure.
Figure 3B:
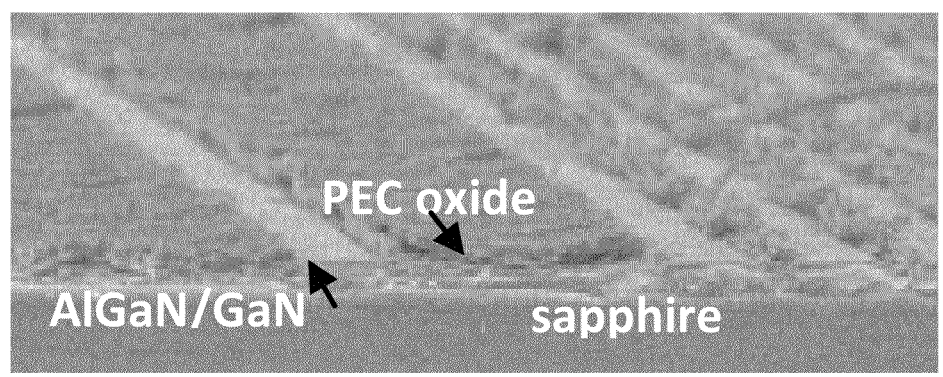

FIGS. 3A-3B are photos of examples in accordance with an embodiment to the present disclosure.

FIG. 3A shows an outer surface of [11 $\bar{2}$ 0]-axially grown III-nitride nanowires of GaN having been selectively transformed into a III-oxide layer of $Ga_2O_3$ by selective photo-enhanced oxidation.

FIG. 3B shows a plurality of AlGaO stripes and a plurality of high bandgap AlGaN stripe openings over a low bandgap GaN/sapphire substrate. The AlGaO stripes are formed using selective photo-enhanced oxidation.

Illustrative Processes

Figure 4:
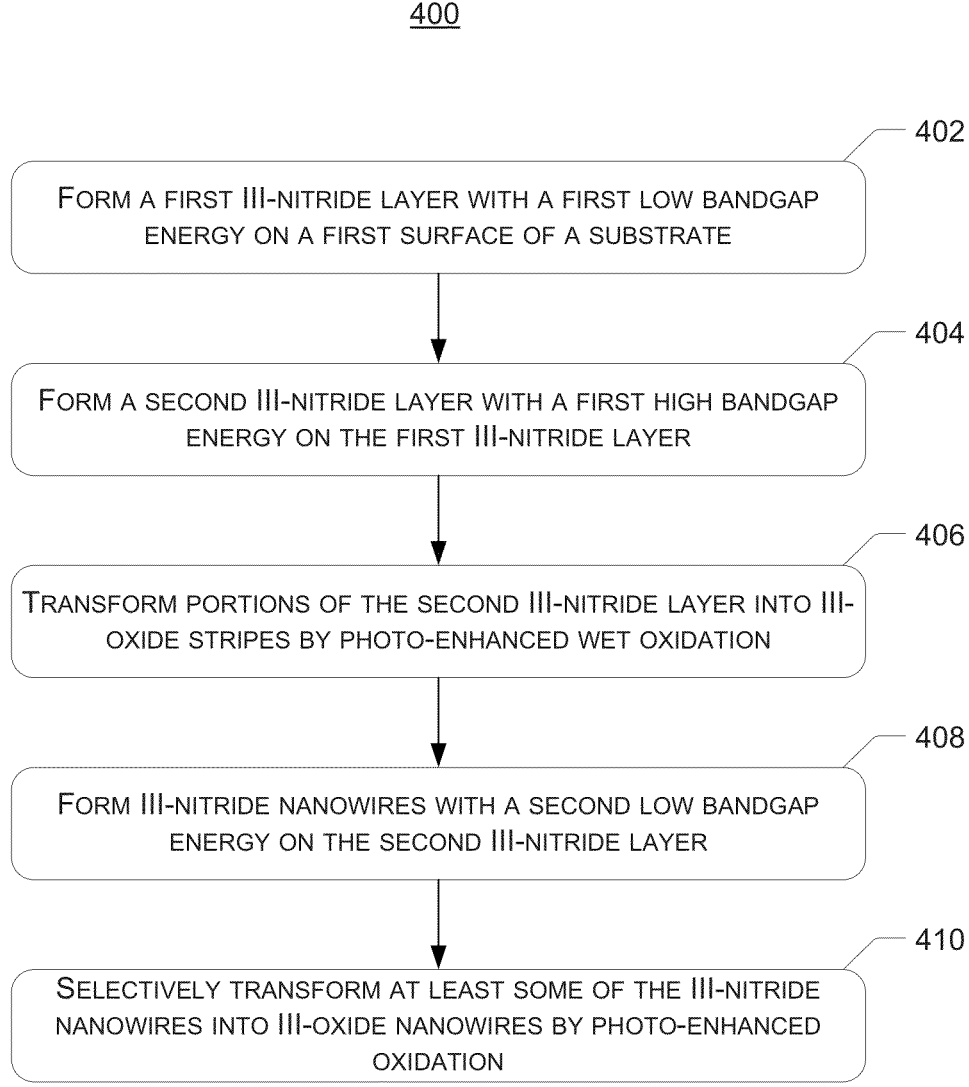
FIG. 4 is a flowchart diagram showing a process of fabrication of an LED structure in accordance with an embodiment to the present disclosure.

FIG. 4 is a flowchart diagram showing a process 400 of fabrication of an LED structure in accordance with an embodiment to the present disclosure.

At 402, the process 400 forms a first III-nitride layer with a first low bandgap energy on a first surface of a substrate. For example, referring to FIG. 1A, the first III-nitride layer 120 is formed on the top surface of the substrate 110. At 404, the process 400 forms a second III-nitride layer with a first high bandgap energy on the first III-nitride layer. For example, referring to FIG. 1A, the second III-nitride layer 130 is formed on the first III-nitride layer 120. At 406, the process 400 transforms portions of the second III-nitride layer into a plurality of III-oxide stripes by photo-enhanced wet oxidation. For example, referring to FIG. 1B, portions of the second III-nitride layer 130 are transformed into III-oxide strips 135(1)-135(M) by photo-enhanced wet oxidation. At 408, the process 400 forms a plurality of III-nitride nanowires with a second low bandgap energy on the second III-nitride layer. For example, referring to FIG. 1O, the III-nitride nanowires 145(1)-145(N) are formed on the second III-nitride layer 130. At 410, the process 400 selectively transforms at least some of the III-nitride nanowires into III-oxide nanowires by selective photo-enhanced oxidation. For example, referring to FIG. 1D, the III-nitride nanowires 145(1)-145(N) are transformed into III-oxide nanowires 145(1)-145(N) by selective photo-enhanced oxidation.

In one embodiment, the photo-enhanced wet oxidation may comprise a use of light source with photon energy exceeding the bandgap energy of said III-nitride and illuminate on a portion of said III-nitride whose surface is not partially covered with masking materials such as photo-resist. The wet oxidation process then takes place in an electrolyte such as buffered $CH_3COOH/CH_3COONH_4$. In one embodiment, the photo-enhanced wet oxidation may exercise on a III-nitride layered structure comprising a first top low bandgap and first bottom high bandgap III-nitride materials. More specifically, selective photo-enhanced wet oxidation with a photonic energy hv, where $E_{g,Lo}<hv<E_{g,Hi}$, can transform III-nitride compounds with $E_{g,Lo}$ into III-oxide compounds. For example, III-nitrides such as low bandgap In/GaN grown on GaN can be transformed into $(In/Ga)_2O_3$ on GaN by selective photo-enhanced wet oxidation.

In one embodiment, the III-nitride nanowires may comprise In/GaN nanowires, and wherein the III-oxide nanowires comprise (In/Ga)2O3 nanowires.

In one embodiment, the substrate may comprise a C plane (0001) sapphire substrate, wherein the first III-nitride layer comprises a layer of GaN, and wherein the III-oxide stripes are aligned substantially parallel to a [11 $\bar{2}$ 0] or [1 $\bar{1}$ 00] direction of GaN.

In one embodiment, the method may further comprise: forming a third III-nitride layer on the second III-nitride layer and over the III-oxide nanowires; and removing the III-oxide nanowires to form a plurality of air gaps in the third III-nitride layer. For example, referring to FIGS. 1E-1G, the third III-nitride layer 150 is formed on the second III-nitride layer 130 and over the III-oxide nanowires 145(1)-145(N), and the III-oxide nanowires 145(1)-145(N) are dissolved to make the air gaps 180(1)-180(N).

Forming a third III-nitride layer may comprise forming the third III-nitride layer by lateral epitaxy of the III-nitride layer using a metal-organic chemical vapor deposition (MOCVD) process. Removing the III-oxide nanowires may comprise dissolving the III-oxide nanowires using an acidic electrolyte, e.g., $H_3PO_4$, or a basic electrolyte, e.g., KOH.

The method may further comprise filling the air gaps with a thermally conductive material, the thermally conductive material comprising a plurality of nanoparticles, a plurality of compound particles, or a combination thereof. Alternatively or additionally, the method may further comprise filling the air gaps with an electrically conductive material, the electrically conductive material comprising a plurality of nanoparticles, a plurality of compound particles, or a combination thereof.

In one embodiment, the method may further comprise forming a plurality of III-nitride layers on the third III-nitride layer to form at least one LED. For example, referring to FIGS. 1E and 1F, the III-nitride layers 150, 160, 170 and 180 are formed to provide an LED structure having one or more LEDs therein.

Figure 5:
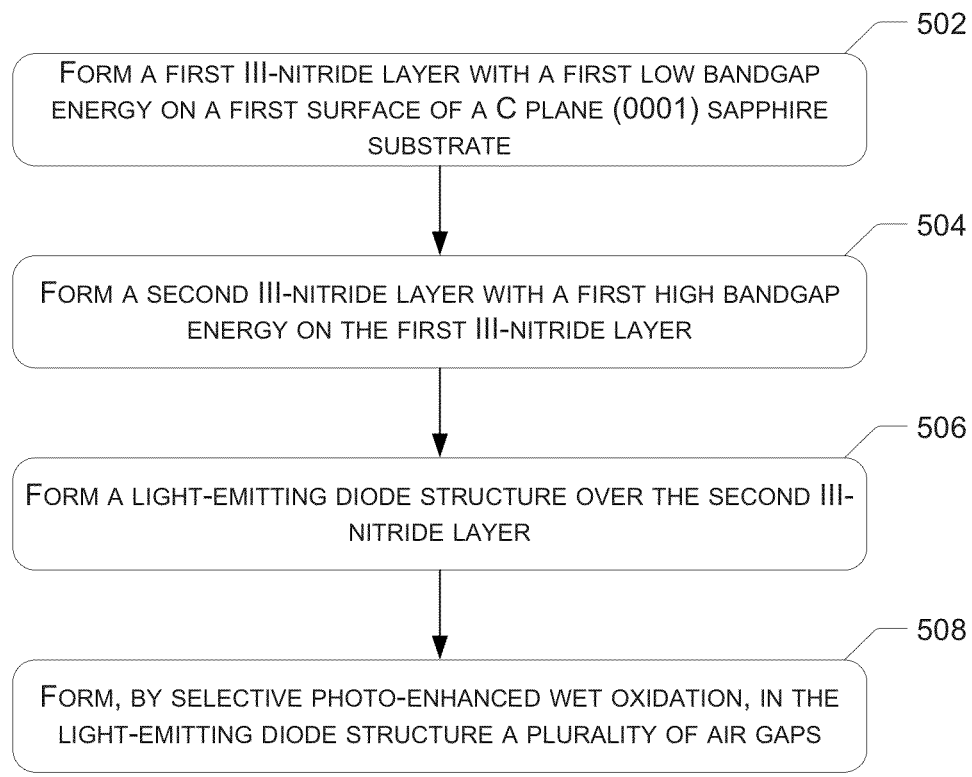
FIG. 5 is a flowchart diagram showing a process of fabrication of an LED structure in accordance with another embodiment to the present disclosure.

FIG. 5 is a flowchart diagram showing a process 500 of fabrication of an LED structure in accordance with another embodiment to the present disclosure.

At 502, the process 500 forms a first III-nitride layer with a first low bandgap energy on a first surface of a C plane (0001) sapphire substrate. At 504, the process 500 forms a second III-nitride layer with a first high bandgap energy on the first III-nitride layer. At 506, the process 500 forms an LED structure over the second III-nitride layer. At 508, the process 500 forms, at least in part by selective photo-enhanced oxidation, in the LED structure a plurality of air gaps that are parallel to one another and adjacent the second III-nitride layer. Again, reference can be made to FIGS. 1A-1G as a result of the operations of the process 500.

In one embodiment, forming, at least in part by selective photo-enhanced oxidation, a plurality of air gaps that are parallel to one another and adjacent the second III-nitride layer of a high bandgap energy may comprise: transforming portions of the second III-nitride layer into a plurality of III-oxide stripes by photo-enhanced wet oxidation; forming a plurality of III-nitride nanowires with a second low bandgap energy on the second III-nitride layer; selectively transforming at least some of the III-nitride nanowires into III-oxide nanowires by selective photo-enhanced oxidation; forming a third III-nitride layer on the second III-nitride layer and over the III-oxide nanowires; and removing the III-oxide nanowires to form the plurality of air gaps.

In one embodiment, the photo-enhanced wet oxidation may comprise photo-enhanced wet oxidation with a photon energy between the first high bandgap energy and the first low bandgap energy.

In one embodiment, removing the III-oxide nanowires may comprise dissolving the III-oxide nanowires using an acidic electrolyte or a basic electrolyte.

In one embodiment, the method may further comprise filling the air gaps with a thermally conductive material, the thermally conductive material comprising a plurality of nanoparticles, a plurality of compound particles, or a combination thereof.

In one embodiment, the method may further comprise, after forming the second III-nitride layer on the first III-nitride layer and before forming the LED structure over the second III-nitride layer, forming a surface passivation layer in a V-notch groove that is in the second III-nitride layer or in a combination of the second III-nitride layer and the first III-nitride layer by selective photo-enhanced oxidation.

In one embodiment, the surface passivation layer may comprise a III-oxide layer.

In one embodiment, forming the LED structure over the second III-nitride layer may comprise forming a third III-nitride layer on the surface passivation layer and the second III-nitride layer by lateral epitaxy of the III-nitride layer using an MOCVD process.

Figure 6:
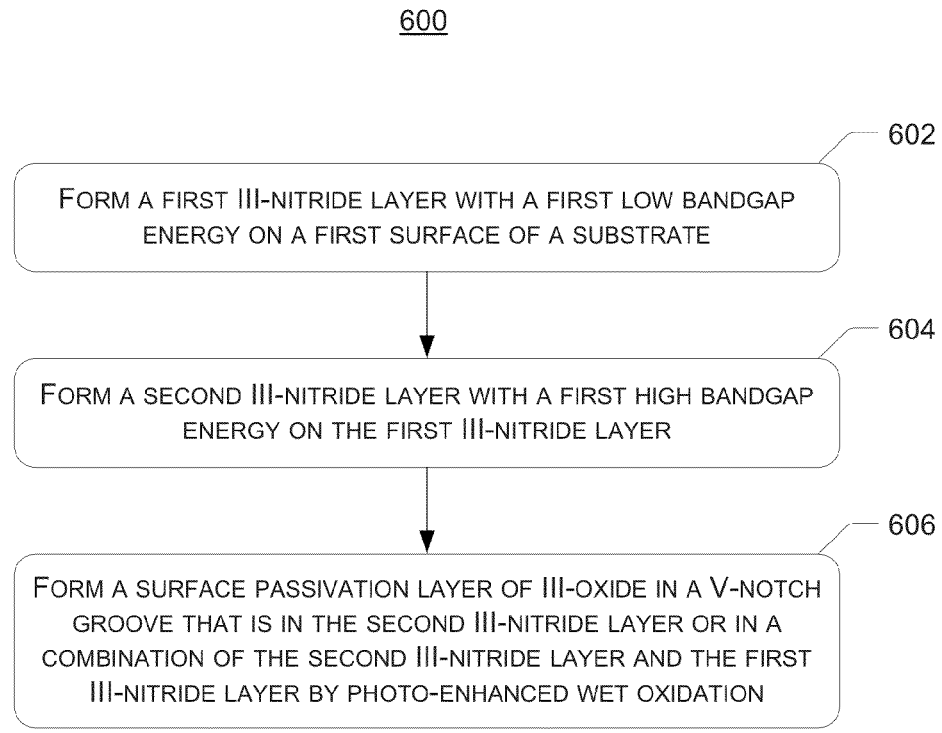
FIG. 6 is a flowchart diagram showing a process of suppression of screw dislocations in an LED structure in accordance with an embodiment to the present disclosure.

FIG. 6 is a flowchart diagram showing a process 600 of suppression of screw dislocations in an LED structure in accordance with an embodiment to the present disclosure.

At 602, the process 600 forms a first III-nitride layer with a first low bandgap energy on a first surface of a substrate. At 604, the process 600 forms a second III-nitride layer with a first high bandgap energy on the first III-nitride layer. At 606, the process 600 forms a surface passivation layer of III-oxide in a V-notch groove that is in the second III-nitride layer or in a combination of the second III-nitride layer and the first III-nitride layer by selective photo-enhanced oxidation. Reference can be made to FIGS. 2A-2B.

In one embodiment, the method may further comprise forming a third III-nitride layer on the surface passivation layer and the second III-nitride layer by lateral epitaxy of the III-nitride layer using an MOCVD process. Reference can be made to FIG. 2C.

CONCLUSION

The above-described techniques pertain to techniques of controlling operations of LED lighting by using the output of a TRIAC dimmer not as a power source but as a lighting control signal. Although the techniques have been described in language specific to structural features and/or methodological acts, it is to be understood that the appended claims are not necessarily limited to the specific features or acts described. Rather, the specific features and acts are disclosed as exemplary forms of implementing such techniques.

It is appreciated that the illustrated apparatus 100 and apparatus 200 are each one example of a suitable implementation of the proposed technique and is not intended to suggest any limitation as to the scope of use or functionality of the various embodiments described. Any variation of the disclosed embodiments made by a person of ordinary skill in the art shall be deemed to be within the spirit of the present disclosure, and thus shall be covered by the scope of the present disclosure.

What is claimed is:

1. A structure comprising:
a substrate structure;
a first group III-nitride layer with a first low bandgap energy formed on a surface of the substrate;
a second group III-nitride layer with a first high bandgap energy formed on the first group III-nitride layer;
a plurality of group III-oxide stripes formed on the second group III-nitride layer; and
a plurality of group III-oxide nanowires formed on the second group III-nitride layer between the group III-oxide stripes;
wherein at least some of group III-nitride nanowires with a second low bandgap energy formed on the second group III-nitride layer between the group III-oxide stripes are selectively transformed into the group III-oxide nanowires by selective photo-enhanced oxidation; and
wherein the first high bandgap energy is higher than the first low bandgap energy, and the first high bandgap energy is higher than the second low bandgap energy.

2. The structure as recited in claim 1, wherein the selective photo-enhanced oxidation comprises photo-enhanced wet oxidation with a photonic energy between the first high bandgap energy and the first low bandgap energy.

3. The structure as recited in claim 1, wherein the group III-nitride nanowires comprise In/GaN nanowires, and wherein the group III-oxide nanowires comprise $(In/Ga)_2O_3$ nanowires.

4. The structure as recited in claim 1, wherein the plurality of group III-oxide stripes are formed by transforming portions of the second group III-nitride layer by photo-enhanced oxidation.

5. The structure as recited in claim 1, wherein the substrate comprises a C plane (0001) sapphire substrate, wherein the second group III-nitride layer comprises a layer of AlGaN, and wherein the group III-oxide stripes are aligned substantially parallel to a $[11\bar{2}0]$ or $[1\bar{1}00]$ direction of GaN.

6. The structure as recited in claim 1, further comprising: a third group III-nitride layer formed on the group III-oxide stripes and the group III-oxide nanowires.

7. The structure as recited in claim 6, further comprising: a plurality of group III-nitride layers formed on the third group III-nitride layer to form at least one light-emitting diode (LED).

8. A structure comprising:
a substrate structure;
a plurality of group III-oxide stripes formed on a first surface of the substrate structure;
a plurality of group III-oxide nanowires formed on the first surface of the substrate structure between the III group-oxide stripes; and
a light-emitting diode (LED) structure formed over the group III-oxide stripes and the group III-oxide nanowires;
wherein at least some of group III-nitride nanowires formed on the first surface of the substrate structure between the group III-oxide stripes are treated with selective photo-enhanced oxidation to form the plurality of group III-oxide nanowires.

9. The structure as recited in claim 8, wherein the substrate structure comprises:
a substrate;
a first group III-nitride layer with a first low bandgap energy formed on a surface of the substrate; and
a second group III-nitride layer with a first high bandgap energy formed on the first group III-nitride layer, wherein the first high bandgap energy is higher than the first low bandgap energy;
wherein a surface of second group III-nitride layer is the first surface of the substrate structure.

10. The structure as recited in claim 9, wherein the plurality of group III-oxide stripes are formed by transforming portions of the second group III-nitride layer by photo-enhanced oxidation.

11. The structure as recited in claim 10, wherein the selective photo-enhanced oxidation comprises photo-enhanced wet oxidation with a photonic energy between the first high bandgap energy and the first low bandgap energy.

12. The structure as recited in claim 8, wherein the group III-oxide nanowires are capable of being removed to form a plurality of air gaps.

13. The structure as recited in claim 12, further comprising: a thermally conductive material filled in the air gaps, and the thermally conductive material comprising a plurality of nanoparticles, a plurality of compound particles, or a combination thereof.

14. The structure as recited in claim 12, further comprising: an electrically conductive material filled in the air gaps, and the electrically conductive material comprising a plurality of nanoparticles, a plurality of compound particles, or a combination thereof.

* * * * *